United States Patent [19]

Natarajan et al.

[11] Patent Number: 5,759,320
[45] Date of Patent: Jun. 2, 1998

[54] METHOD OF FORMING CAVITY SUBSTRATES USING COMPRESSIVE PADS

[75] Inventors: Govindarajan Natarajan, Pleasant Valley; Robert W. Pasco, Wappingers Falls; Charles H. Perry; Vincent P. Peterson, both of Poughkeepsie, all of N.Y.

[73] Assignee: International Business Machines Corporation, Armonk, N.Y.

[21] Appl. No.: 834,302

[22] Filed: Apr. 13, 1997

[51] Int. Cl.[6] .................................................. B32B 31/20
[52] U.S. Cl. ........................ 156/89; 156/228; 156/285; 156/289; 156/323; 264/241; 264/313
[58] Field of Search ............................. 156/89, 228, 285, 156/289, 323, 381, 382, 580, 583.1, 583.3; 425/500, 508; 264/241, 313, 316

[56] References Cited

U.S. PATENT DOCUMENTS

| | | | |
|---|---|---|---|
| 4,636,275 | 1/1987 | Norell | 156/289 |
| 4,680,075 | 7/1987 | McNeal et al. | 156/289 |
| 4,737,208 | 4/1988 | Bloechle et al. | 156/90 |
| 5,478,420 | 12/1995 | Gauci et al. | 156/89 |
| 5,538,582 | 7/1996 | Natarajan et al. | 156/285 |
| 5,601,673 | 2/1997 | Alexander | 156/89 |
| 5,665,195 | 9/1997 | Natarajan et al. | 156/497 |
| 5,676,788 | 10/1997 | Natarajan et al. | 156/285 |
| 5,683,535 | 11/1997 | Karr | 156/285 |

OTHER PUBLICATIONS

Phillips, C. C., Jr., "Fixture for Fabricating Complex Substrate Design From Green Sheet Ceramics", IBM Technical Disclosure Bulletin, vol. 16, No. 11, Apr. 1974, p. 3559.

*Primary Examiner*—James Sells
*Attorney, Agent, or Firm*—Aziz M. Ahsan

[57] ABSTRACT

The present invention relates generally to a new apparatus and method for forming cavities in semiconductor substrates without the necessity of using an insert. More particularly, the invention encompasses an apparatus and a method for fabricating cavities in semiconductor substrates wherein a cured thick compressible elastic pad is placed over the cavity prior to lamination and caused to conform to the contour of the cavity, thus preventing collapse of, or damage to, the cavity shelves or corners during the lamination process. After the lamination process, the cured thick compressible elastic pad is conveniently removed from the cavity area without causing any damage to the cavity shelves or corners or having any paste pull-outs. This pad can be reused multiple number of times to form these MLC cavity substrates.

18 Claims, 3 Drawing Sheets

METHOD OF FORMING CAVITY SUBSTRATES USING COMPRESSIVE PADS

CROSS-REFERENCE TO RELATED PATENT APPLICATION

This Patent Application is related to U.S. patent application Ser. No. 08/834,304, filed on Apr. 15, 1997, Attorney Docket No. FI9-97-053, entitled "APPARATUS FOR FORMING CAVITY SUBSTRATES USING COMPRESSIVE PADS", assigned to the assignee of the instant Patent Application, and the disclosure of which is incorporated herein by reference.

FIELD OF THE INVENTION

The present invention relates generally to a new apparatus and method for forming cavities in semiconductor substrates. The apparatus comprises the insertion of at least one compressive pad into a cavity in a green sheet so that the cavity remains intact during the lamination of the green sheets that are being pressed and laminated.

BACKGROUND OF THE INVENTION

Semiconductor substrates and devices are becoming smaller and more dense with the evolution of new technologies. However, increases in circuit density produce a corresponding increase in overall manufacturing problems. These manufacturing problems must however be kept to a minimum in order for the semiconductor manufacturer to remain competitive. The semiconductor manufacturers are therefore constantly being challenged to improve the quality of their products by identifying and eliminating defects which produce defective parts or components. Whereas significant improvements are being made to eliminate systematic defects by reducing process variability, process improvements alone are not sufficient to eliminate all the random defects which effect both yield and reliability. Historically, screening techniques have been employed to improve product failure rates to acceptable levels by culling out many of these random defects.

In their desire to improve their products, the semiconductor manufacturers are constantly finding new ways and new techniques to improve or provide new products. It has been found that for some applications, one could make a ceramic carrier or substrate (hereafter just substrate) having a cavity and then have the semiconductor chip placed inside the cavity and secured to the substrate. These semiconductor substrates are often referred to as modules and could be made from a single or a multi-layer ceramic sheet or green sheet forming a single layer ceramic module or a plurality of ceramic layers forming an MLC (multilayer ceramic) module.

While the remaining discussion will be directed to MLC modules, it should be understood that the teachings of the present invention can be equally applicable to single layer modules.

MLC modules having single or multiple cavities are normally used in the electronic industry to package high performance integrated circuits or chips (hereafter just chips). These high performance chips have a large number of external inputs/outputs (called I/Os), such as pads or solder balls, to name a few, and these chips have a very high power dissipation. In order to accommodate such high performance chips, the MLC module also has to provide a high number of external I/Os, such as pads, pins, solder balls, to name a few, and also be able to handle the very high power dissipation that is being generated both from the module as well as the chip. Furthermore, there may also be wire bond pads on the shelves within the cavity.

The single or multiple cavities in an MLC substrate are normally formed by laminating the green sheets during the lamination process typically with the aid of a plug or insert, such as, disclosed in IBM Technical Disclosure Bulletin, "Fixture For Fabricating Complex Substrate Design From Green Sheet Ceramics", Phillips, Vol. 16, No. 11, Page 3559(Apr. 1974), the disclosure of which is incorporated by reference herein, this contoured laminating fixture with projections that coincide with the recesses in the ceramic substrate, in turn prevents the collapse or deformation of the recesses in the ceramic green sheet during lamination. This method of producing single or multiple cavities requires machining of the inserts with high precision and with high level of surface finish.

Inherently, the cost of such plugs or inserts is very high compared to the cost of the substrate. Additionally, these inserts or plugs do not provide the flexibility of using the same inserts for cavities having various shapes and sizes. Furthermore, placing these inserts in the cavities and then subsequently removing them is an expensive process. It has also been observed that subsequent removing of these inserts, in some cases, has lead to the delamination of the ceramic green sheets or other damage to the green ceramic body. Another drawback with these solid inserts is the need to clean them prior to every use to avoid the paste pull-outs or damage to the green ceramic layers or pads. Even with cleaning of these inserts, paste pull-out often occurs due to the lack of an effective release layer.

Another method of producing these single or multiple cavities in the MLC substrate would be to machine the cavities after the green sheets have been stacked and laminated, but this would not be a cost effective way of producing parts in a high volume manufacturing operation.

It is also possible to form cavities in the MLC substrate with no inserts. This could be done for cases where the lamination conditions are such that there is no resulting deformation in the green ceramic body. In these cases, typically, the lamination pressures are very low and the green sheet formulation is such that the dimensional control of products is achieved by altering the sintering process. However, in a high volume manufacturing operation, tailoring the green sheet formulation and developing a sintering cycle for every product would be cost prohibitive and time consuming.

Besides, this approach typically needs an adhesive between layers and multiple lamination steps to achieve the end result. Thus, some of the problems associated with this low pressure lamination process are that no process window for dimensional control is available for the sintered body. Delamination of the ceramic green sheets could happen in sintering due to the removal of the adhesive and the density gradients in the starting structure that are normally present could result in poor substrate dimensional control. Furthermore, there could be substantial increase in stacking and lamination cost and limitation in metal loading on the green sheets to have effective green sheet bonding.

The prior art has approached this problem in other ways as well.

U.S. Pat. No. 4,680,075(McNeal et al.) and U.S. Pat. No. 4,636,275(Norell), the disclosures of which are incorporated by reference herein, disclose laminating with a preformed plugs with thermoplastic material such as polyvinyl chloride, polyolefin or a poly carbonate. This plug goes through a plastic deformation at lamination temperature and pressure to fill the cavity.

U.S. Pat. No. 4,737,208(Bloechle et al.), the disclosure of which is incorporated by reference herein, discloses a method of laminating a printed wiring board (non-ceramic) by utilizing a metallic template (which relieves some of the stresses on the corners of the layers), a fluoropolymer (such as TFE) release layer and a putty-like conformal material (for example, flowable and not polymerized rubber) which fills the cavity.

U.S. Pat. No. 5,538,582(Natarajan, et al.), presently assigned to the assignee of the instant patent application, and the disclosure of which is incorporated herein by reference, discloses a method for forming cavities in multilayer ceramics without using an insert.

In every cavity formation technique, it is essential that the material set is chosen such that a cavity profile with sharp corners and flat wire bonding shelves is achieved. When improper plug and/or cavity-fill materials are chosen, the resulting cavity turns out to have rounded edges and corners and/or sloped wire bond shelves and/or paste pullouts, etc.

The present invention, however, solves these and other problems and the result is a ceramic cavity substrate with well-defined features as more fully described in the following description taken along with the accompanying drawings.

PURPOSES AND SUMMARY OF THE INVENTION

The invention is a novel apparatus and insertless method for forming cavity substrates using at least one elastic pad.

Therefore, one purpose of the present invention is to provide an apparatus and method that will form cavities in a semiconductor substrate without the necessity of using a solid insert.

Another purpose of the present invention is to provide an apparatus and method that will form cavities in a semiconductor substrate without causing damage to the ceramic body or have paste pull-outs.

Yet another purpose of the present invention is the providing of at least one elastic compressible pad which is used to avoid any damage to the ceramic body and to prevent any paste pull-outs.

Therefore, in one aspect this invention comprises a method of forming a ceramic substrate having at least one cavity, said method comprising the steps of:

(a) placing at least one ceramic green sheet over at least one first plate, wherein at least one of said at least one ceramic green sheet has at least one cavity, (b) placing at least one substantially planar pad over said ceramic green sheet such that at least a portion of said pad covers at least a portion of said at least one cavity, and wherein said pad has a compression modulus of less than about 65 psi, a durometer rating of less than about 30, and an elongation characteristic of greater than about 350 percent at room temperature, (c) applying lamination pressure to said at least one pad and said at least one ceramic green sheet, such that said pad conforms to the shape of said cavity and prevents the deformation of said cavity during said lamination pressure step, and thereby forms said ceramic substrate having at least one cavity.

In another aspect this invention comprises an apparatus for forming ceramic substrate having at least one cavity, comprising, (a) a first plate to support at least one ceramic green sheet, wherein at least one of said at least one ceramic green sheet has at least one cavity, (b) at least one substantially planar pad over said ceramic green sheet such that at least a portion of said pad covers at least a portion of said at least one cavity, and wherein said pad has a compression modulus of less than about 65 psi, a durometer rating of less than about 30, and an elongation characteristic of greater than about 350 percent at room temperature.

(c) means for applying lamination pressure to cause at least a portion of said pad to conform to contours of said cavity, and wherein said pad prevents the deformation of said cavity during said application of said lamination pressure, and thereby forms an apparatus for forming ceramic substrate having at least one cavity.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

Figure 1:
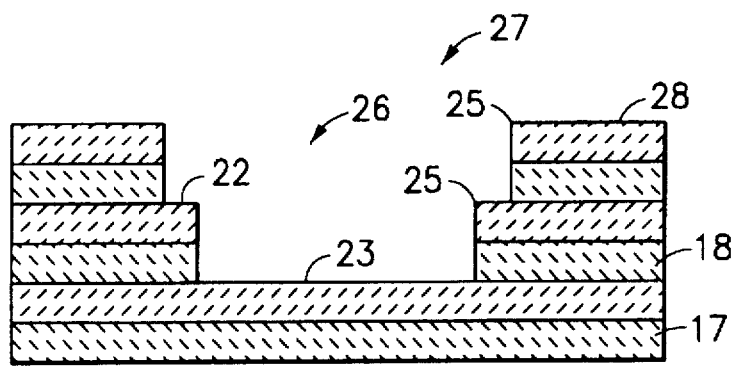
FIG. 1, is a cross-sectional view of a MLC cavity substrate showing undistorted shelves.

Referring now to the Figures in more detail, and particularly referring to FIG. 1, there is shown a MLC (multilayer ceramic) cavity substrate 27, having at least one cavity 26, and at least one shelf 22. Individual ceramic green sheets 17 and 18, are used to build the MLC cavity substrate 27. These green sheets are typically fabricated using a tape casting process which is well known in the art. Briefly, large rolls or sheets of ceramic green sheets (i.e., unfired ceramic layers) are produced, then individual green sheets 17 and 18, are blanked out of these large rolls or sheets of ceramic green sheets. Subsequently, individual ceramic green sheets 18, that will form the cavity 26, are also blanked or an open area 26, is punched appropriately to form the ceramic layers having the cavity 26.

Typically, the material for the ceramic green sheets 17 and 18, is preferably selected from a group comprising alumina, alumina with glass frits, aluminum nitride, aluminum nitride with sintering aids, borosilicate glass and glass ceramic, to name a few, although other ceramic materials may also be used.

Wiring metallurgy, which is also well known in the art, is then applied through a standard screening process onto one or more surfaces of the individual ceramic green sheets 17 and 18, including those parts of the green sheets that will form shelves 22. Base area 23, typically is dedicated for the attachment of a semiconductor element, such as, for example, a chip (not shown), while surface area 28, forms the upper surface of the MLC cavity substrate 27. The shelves 22, typically have pads (not shown) for electrical connection (for example, by wire bonds) to the semiconductor element which is itself secured to the base area 23.

As shown in FIG. 1, the cavity substrate 27, has sharp corners 25, and flat shelves 22, which is difficult to obtain in actual practice due to damage incurred during lamination.

Figure 2:
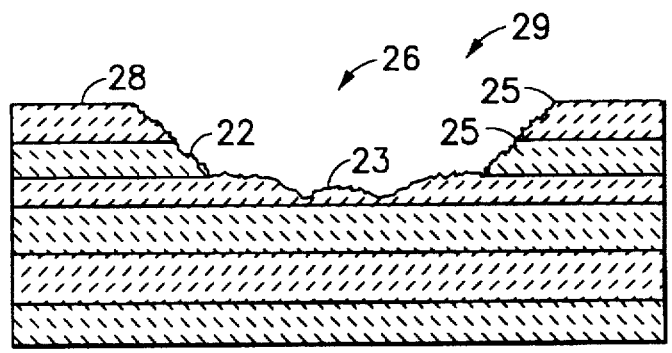
FIG. 2, is a cross-sectional view of a MLC cavity substrate similar to FIG. 1, but showing distorted shelves due to damage incurred during lamination.

FIG. 2, is an exaggerated view of a MLC cavity substrate 29, formed by a prior art process, where the corners 25, became rounded and the shelves 22, became distorted during the lamination process.

Figure 3:
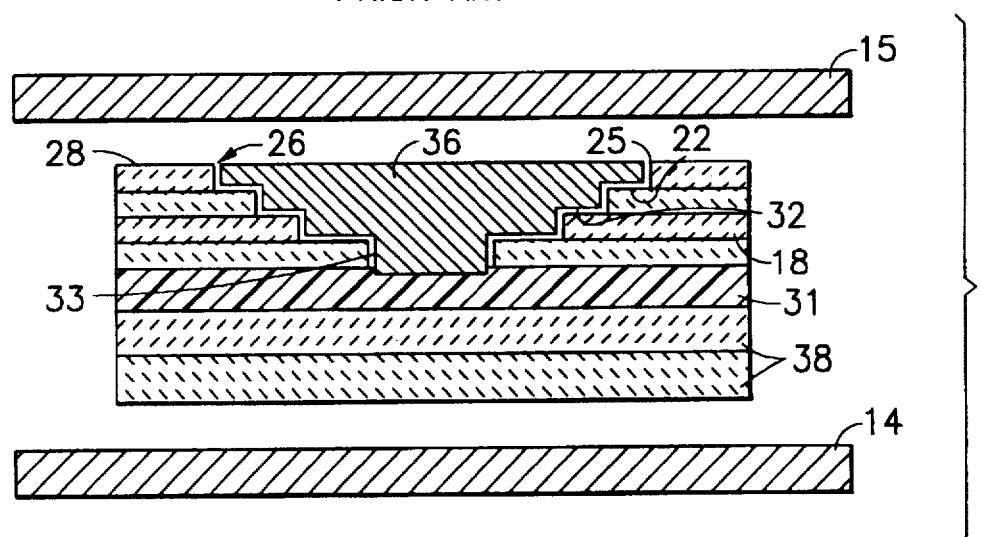
FIG. 3, is a cross-sectional view of a MLC cavity substrate prior to lamination with the prior art solid insert in the cavity to form an unsintered green sheet cavity substrate.

FIG. 3, is a cross-sectional view of a MLC cavity substrate 27, prior to the lamination with a prior art solid insert 36, in the cavity 26, to form an unsintered green sheet cavity substrate 27. This prior art method is similar to the one, such as, disclosed in U.S. Pat. No. 5,478,420(Gauci, et al), assigned to the assignee of the instant patent application and the disclosure of which is incorporated herein by reference. On a first or bottom plate 14, there is placed at least one ceramic layer 38. A layer of compressible material 31, is placed over the ceramic layer 38, and stacked thereon are the cavity forming layers 18, that will form cavity substrate 27. Inside the cavity 26, a machined/preformed plug 36, is inserted. On the surface 28, of this green sheet stack is placed a second or a top solid metal plate 15. Lamination pressure is typically applied to the upper plate 15, which essentially applies the pressure to the stack. Here the ceramic green sheet body moves and hugs the plug and after the lamination pressure is removed a cavity 26, is formed in the laminated green sheets. The plug 36, has steps 32, which correspond to the shelves 22, and profile 33, which essentially matches the desired profile of the cavity 26. After the green sheets 18, have been laminated, the plug 36, has to be separated from the laminated green sheet 27. This removal process of the sold insert 36, in some cases has caused mechanical damage to the green laminate 27, thus creating green sheet laminate 29. Of course any features in and around the cavity 26, may also get damaged. It should be noted that the plug or insert 36, has to be machined or preformed every time it is used. It has now been found that the making of the cavity 26, using a solid insert, such as, insert 36, is not only expensive but also very time consuming.

Figure 4:
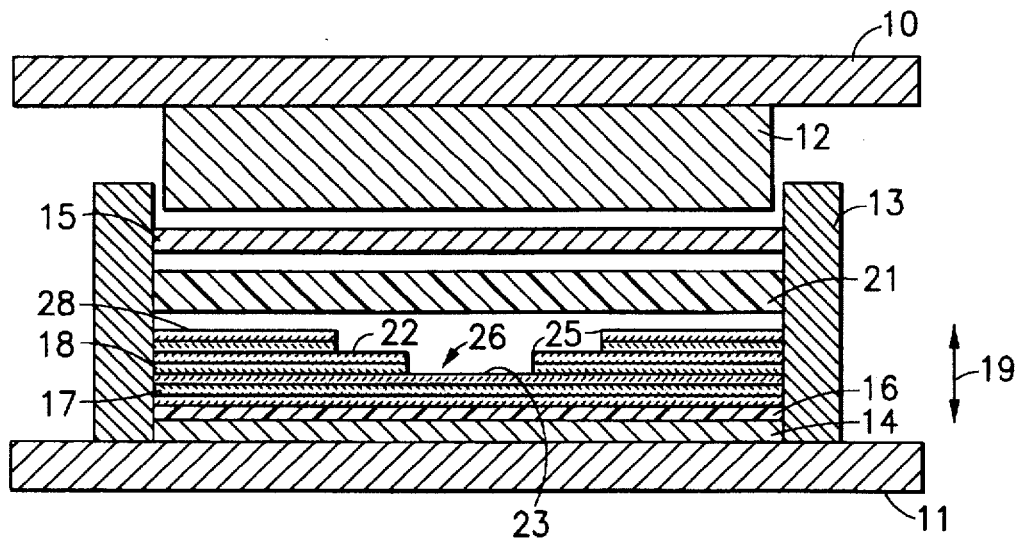
FIG. 4, is a cross-sectional view of a MLC cavity substrate made in accordance with this invention where at least one inventive elastic pad has been positioned on the cavity green sheet prior to the lamination process.

Referring now to FIG. 4, there is shown a first or bottom plate 14, placed on which is at least one non-sticky material or non-adhesive layer 16, such as a Mylar (polyethylene terephthalate) layer 16. On the Mylar layer 16, there are cavity forming green sheet layers 17 and 18, that are stacked and which will subsequently form the MLC cavity substrate 27. Layers 17 and 18, are typically of the same material, except that layer 18, has at least one opening 26, that will form the cavity 26. On the upper surface 28, of the layer 18, the inventive elastic compressible pad 21, is placed. Placed on the elastic compressible pad 21, is the second or top plate 15. The entire stack from bottom plate 14, to the top plate 15, is preferably placed inside a frame 13. The frame 13, helps in preventing the green sheet layers 17 and 18, from sliding during the lamination process. The frame 13, and its contents sit on the first or bottom lamination platen 11. A punch 12, mounted on a second or top lamination platen 10, is used to apply pressure in the direction 19, to the stack within the frame 13, is more clearly shown in FIG. 4, in an open position. For the ease of understanding this inventive process, the various components in the apparatus are shown with a separation between them, however, when these items are placed together there is no gap between them.

The flat elastic compressible pad 21, could be a combination of one or more thinner elastic flat pads/and or layers 21.

Figure 5:
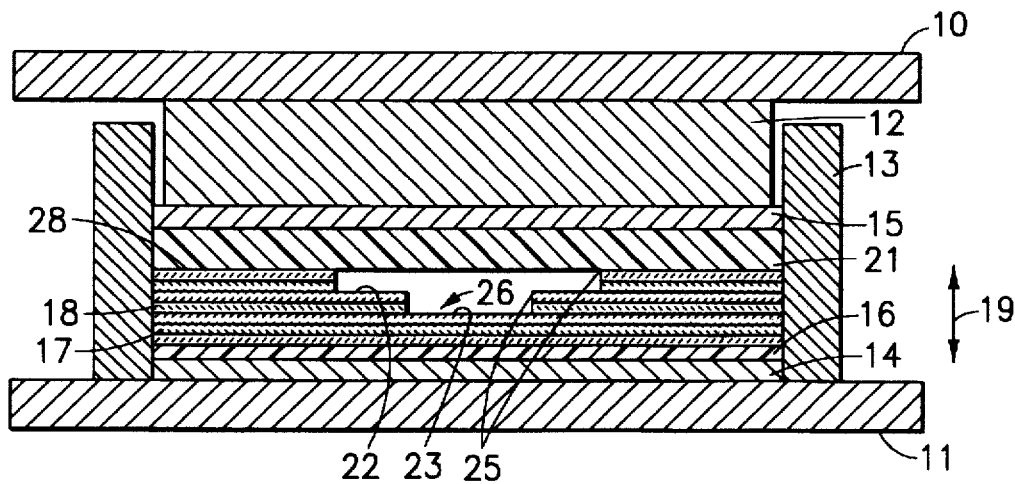
FIG. 5, is a cross-sectional view of the MLC cavity substrate of FIG. 4, during lamination with the inventive elastic pad in contact with the green sheet laminate but with zero lamination pressure.

FIG. 5, is similar to FIG. 4, except that it shows the total assembly is ready for the lamination process, but just prior to the compression process.

Figure 6:
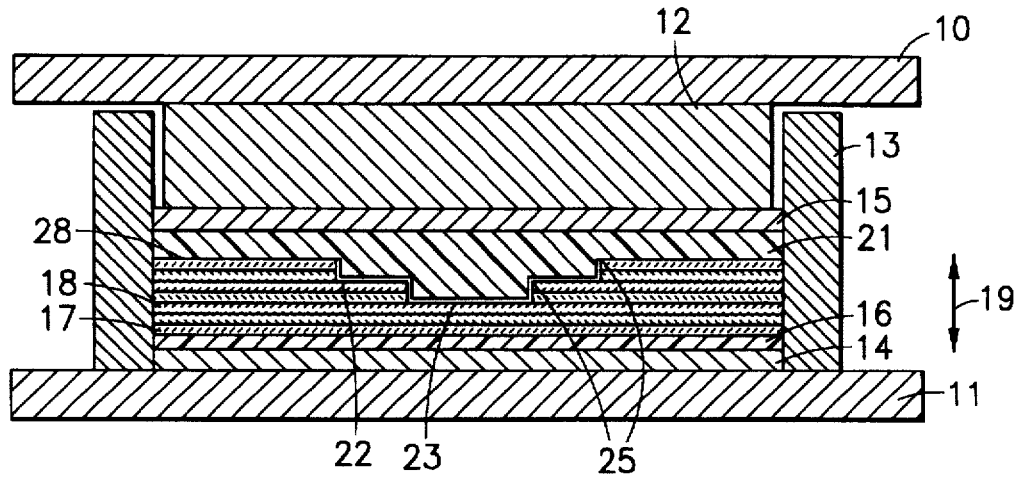
FIG. 6, is a cross-sectional view of the MLC cavity substrate of FIG. 4, during the lamination with the inventive elastic pad conforming to the surface and the cavity of the MLC substrate.

FIG. 6, shows the assembly described in FIGS. 4 and 5, well into its lamination cycle. Here the elastic compressible flat pad 21, under pressure has completely conformed to the cavity 26. The elongation of the elastic compressible pad 21 should be better than 350 percent to ensure conformability with no damage to cavity edges and corners 25 and shelf 22. Higher rate of elongation of the compressible pad 21, with least applied pressure is desirable. In general a compression modulus of less than about 100 psi at about 30 percent compressed is needed. The compressible pad 21, on compression extrudes into the cavity 26, at very low pressure and fills the same. Once the cavity is filled with the solid elastic pad the lamination proceeds as if a planar substrate is being laminated. The lamination pressures usually are above 2,000 psi, but for most applications this lamination pressure is below about 8,000 psi. As can be clearly seen in FIG. 6, that the inventive compressible elastic pad 21, has completely conformed to the walls of the cavity 26, without any damage to any feature inside the cavity 26, such as, for example, the sharp corners 25, the shelves 22, etc.

Figure 7:
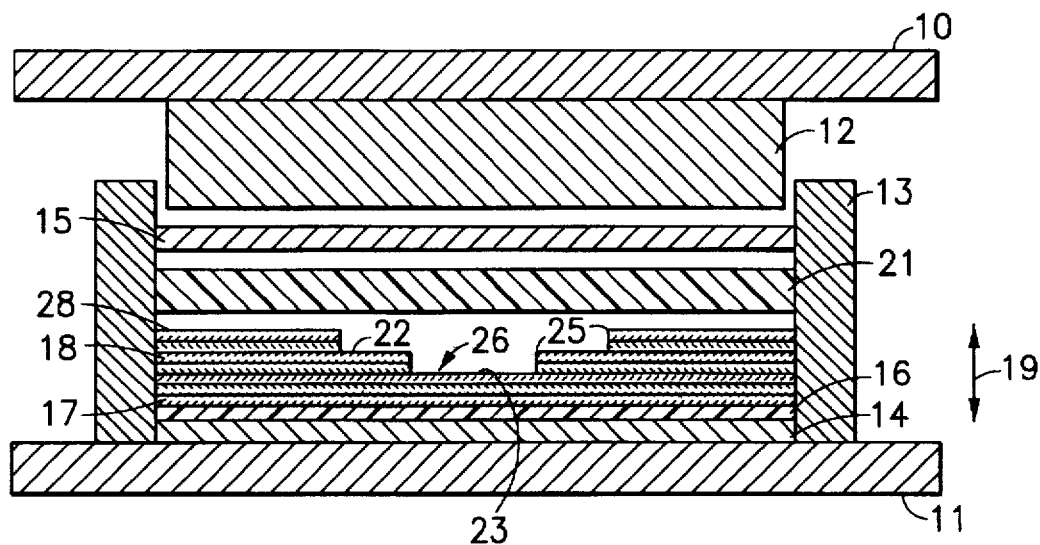
FIG. 7, is a cross-sectional view of the MLC cavity substrate of FIG. 4, after lamination showing the undistorted formed cavity and also showing that the elastic pad had regained its original shape and is now ready for reuse.

FIG. 7, shows the MLC cavity substrate 27, of FIG. 4, after it has been laminated. As one can see that the elastic compressible pad 21, has sprung back to its original shape and so removal of the pad 21, from the cavity 26, is automatic and instantaneous. It should be noted that the elastic compressible pad 21, is reusable, and is now ready for use to form another cavity substrate. The substrate 27, that is formed using the pad 21, has undistorted cavities and also has no deleterious effects on the shape or characteristics of the elastic compressible pad 21.

Figure 8:
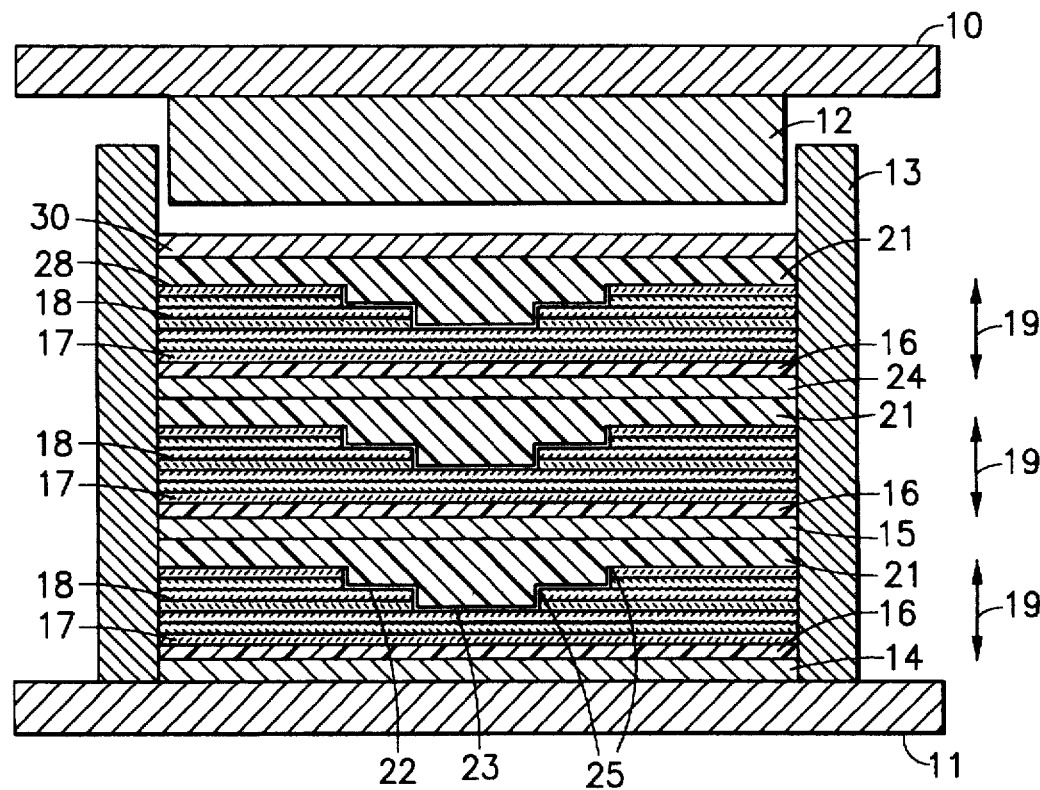
FIG. 8, is a cross-sectional view of another embodiment of this invention where multiple MLC cavity substrates during lamination have individual elastic pads conforming to the respective cavities.

FIG. 8, is a cross-sectional view of another embodiment of this invention where multiple MLC cavity substrates 27, can be formed using the lamination process of this invention, where individual elastic compressible pads 21, are placed on the surface 28, and these pads 21, conform to the respective cavities during the lamination process. This method allows the making of multiple cavity laminates or substrates 27, in a single lamination cycle. This improvement of course reduces the cycle time per substrate 27, and also reduces the processing cost per substrate 27.

The choice of material for the elastic pad 21, is very important for the present invention. The pad 21, should be soft, that is, its durometer rating should be less than about Shore A 30, it should be capable of elongation of greater than at least about 350 percent, it should have a low modulus of elasticity, preferably of less than about 0.1 MPa. The preferred elongation is around 800 percent with a compression modulus of about 65 psi (at 30 percent compressed) at room temperature. It should also be tough and tear-resistant, i.e., it should be between about 50 to about 200 PPI (pounds per inch). These properties are important so that when the flat pad 21, is caused to conform to the shape of the cavity 26, the sharp corners 25, of the cavity 26, do not become rounded, and the cavity shelves 22, do not become distorted. The most suitable material for the elastic pad 21, has been found to be cured silicone rubber. Preferably the pad 21, is a fully or mostly cured thick elastic pad 21. However, generally speaking, silicone material is best for all laminating pressures, including laminating at higher pressures above about 2,500 psi. Furthermore, the material thickness of the pad 21, is also of importance. For most applications it has been found that the thickness of the pad 21, is in the range of between about 10 mils to about 0.25 inches, depending upon the depth of the cavity 26. It is projected that the thickness for the pad 21, of above about 0.25 inch, the pressure distribution in the cavity area 26, would not be uniform and thus could result in the deformation of the substrate.

The pad 21, is preferably selected from a group comprising of silicone and silicone with additives. These additives for silicone could be selected from a group comprising of alumina, fiber glass, metal particles, metal oxide particles, to name a few.

It is preferred that at least one non-sticky material 16, is placed between the first plate 14, and the ceramic green sheet 17 or 18. This non-adhesive material 16, prevents the adhesion of the ceramic green sheet 17 or 18, to the first plate 14, especially, during the lamination process. This non-sticky material 16, could be a polymer. It is preferred that the non-sticky material 16, is selected from a group comprising of elastomer, latex rubber, Mylar and polyethylene, to name a few.

The apparatus and method described in FIGS. 4, 5, 6, 7 and 8, use uniaxial lamination. However, the present invention is not restricted by any lamination technique and can be used with any lamination pressure process, such as, for example, hydraulic pressure, hydrodynamic pressure, isostatic pressure, to name a few.

For some applications, the green sheet and/or the pad and/or any other related item could be placed inside at least one environmental enclosure. This environmental enclosure could be a thermal envelope, such as, a furnace. However, this environmental enclosure could be a collapsible bag, such as, a polymeric bag, an elastomeric bag, to name a few. However, this environmental enclosure could also be a fluid barrier container.

The cavity substrate 27, shown in FIG. 1, is illustrative of that obtained by Applicants' inventive apparatus and method.

EXAMPLES

The following examples are intended to further illustrate the invention and are not intended to limit the scope of the invention in any manner.

Example 1

Several samples of multi-layer ceramic bodies containing cavities were fabricated using the process of this invention. In one sample a stack of cavity containing metallized ceramic layers were placed in a lamination frame, and the ceramic layers were separated from the bottom lamination plate by a layer of Mylar, and the second plate by a 0.125 inch thick silicone rubber pad. The thick silicone pad had a compression modulus of about 60 psi at 30 percent compressed state (at room temperature) and an elongation of about 900 percent. The assembly was laminated under pressure to about 6000 psi and temperature to about 90° C. in an uniaxial press. After the lamination the cavity substrate was then removed from the frame and inspected. It was found that the cavity and the ceramic body had good dimensional control. More significantly, the silicone pad had retained its original shape and characteristics for use in subsequent cavity product lamination due to elastic and tear resistant nature of the base material which was fully polymerized.

Example 2

In this example, an assembly of ceramic layers were stacked and laminated in a manner described in Example 1, but the silicone pad was not used. This sample produced severe cavity deformation and hence was not acceptable as a ceramic chip carrier.

Example 3

In another sample an assembly of ceramic layers were stacked and laminated in a manner described in Example 1, but the silicone rubber pad used was approximately 0.07 inches thick. Two such pads were used one above the other. The results were similar to the one obtained in Example 1.

Example 4

In this example, an assembly of ceramic layers were stacked and laminated in a manner described in Example 1, but two layers of silicone rubber pads of different thicknesses were used. The first rubber pad had a thickness of about 0.015 inch and the second rubber pad had a thickness of about 0.125 inch. The results obtained here again were similar to Example 1.

Example 5

In this example, another assembly of ceramic layers were stacked and laminated in a manner described in Example 1, but the thickness of the silicone pads used were about 0.125 inch thick and three such pads were used. In this case the results obtained were not acceptable. The cavity substrate that was produced showed sloped shelves in the cavity and the bottom of the cavity was also not flat.

Example 6

In this example, an assembly of ceramic layers were stacked and laminated in a manner described in Example 1, but the silicone pads used were softer than the ones used in Example 1. The elongation characteristic of the pad was about 1000 percent and compression modulus was about 50 psi, at room temperature. Here again the cavity definition and substrate dimensions were good.

Example 7

In this example, an assembly of ceramic layers were stacked and laminated in a manner described in Example 1, but the silicone pads used were softer than the ones used in Example 1. The elongation characteristic of the pad was about 300 percent and compression modulus was about 120 psi, at room temperature. In this case the cavity profile of the product that was obtained was not well defined as it had sloped shelves and rounded cavity edges.

Example 8

In this example, an assembly of ceramic layers were stacked and laminated in a manner described in Example 1, but there were three such assemblies within the lamination frame. Here again the cavity definition and substrate dimensions of all three laminates were very good.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of forming a ceramic substrate having at least one cavity, said method comprising the steps of:

(a) placing at least one ceramic green sheet over at least one first plate, wherein at least one of said at least one ceramic green sheet has at least one cavity, (b) placing at least one substantially planar pad over said ceramic green sheet such that at least a portion of said pad covers at least a portion of said at least one cavity, and wherein said pad has a compression modulus of less than about 65 psi, a durometer rating of less than about 30, and an elongation characteristic of greater than about 350 percent at room temperature, (c) applying lamination pressure to said at least one pad and said at least one ceramic green sheet, such that said pad conforms to the shape of said cavity and prevents the deformation of said cavity during said lamination pressure step, and thereby forms said ceramic substrate having at least one cavity.

2. The method of claim 1, wherein said at least one pad is a fully or mostly cured thick elastic pad.

3. The method of claim 1, wherein said pad is selected from a group consisting of silicone and silicone with additives.

4. The method of claim 3, wherein said additives for silicone are selected from a group consisting of alumina, fiber glass, metal particles and metal oxide particles.

5. The method of claim 1, wherein said pad has a tear resistance of at least about 50 PPI.

6. The method of claim 1, wherein the material for said ceramic green sheet is selected from a group consisting of alumina, alumina with glass frits, aluminum nitride, aluminum nitride with sintering aids, borosilicate glass and glass ceramic.

7. The method of claim 1, wherein at least one non-sticky material is placed between said first plate and said ceramic green sheet.

8. The method of claim 7, wherein said at least one non-sticky material consists of a polymer.

9. The method of claim 7, wherein said at least one non-sticky material is selected from a group consisting of elastomer, latex rubber, polyethylene terephthalate and polyethylene.

10. The method of claim 1, wherein said pad and said at least one ceramic green sheet are contained within at least one frame.

11. The method of claim 1, wherein said lamination pressure is less than about 8,000 psi.

12. The method of claim 1, wherein said lamination pressure is selected from a group consisting of isostatic pressure, hydrodynamic pressure and hydraulic pressure.

13. The method of claim 1, wherein said at least one ceramic green sheet and said pad are inside at least one environmental enclosure.

14. The method of claim 13, wherein said environmental enclosure is selected from a group consisting of a thermal envelope, a collapsible bag and a fluid barrier container.

15. The method of claim 13, wherein said environmental enclosure is selected from a group consisting of a polymeric bag and an elastomeric bag.

16. The method of claim 1, further comprising a step, prior to applying said lamination pressure, of placing at least one second plate over said pad, such that during said step of applying said lamination pressure at least one of said first plate and at least one of said second plate moves closer to one another.

17. The method of claim 1, further comprising a step, after said step of applying said lamination pressure, of removing said pad from said cavity.

18. The method of claim 1, wherein said ceramic green sheet is pre-heated prior to said application of said lamination pressure.

* * * * *